United States Patent
Kim et al.

(10) Patent No.: US 9,716,171 B2
(45) Date of Patent: Jul. 25, 2017

(54) SEMICONDUCTOR DEVICE

(71) Applicant: Magnachip Semiconductor, Ltd., Cheongju-si (KR)

(72) Inventors: Gukhwan Kim, Cheongju-si (KR); Boseok Oh, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 71 days.

(21) Appl. No.: 14/331,409

(22) Filed: Jul. 15, 2014

(65) Prior Publication Data

US 2015/0228742 A1 Aug. 13, 2015

(30) Foreign Application Priority Data

Feb. 7, 2014 (KR) .................. 10-2014-0014210

(51) Int. Cl.
*H01L 29/423* (2006.01)
*H01L 29/78* (2006.01)
*H01L 21/8234* (2006.01)
*H01L 27/088* (2006.01)
*H01L 29/66* (2006.01)

(52) U.S. Cl.
CPC .. *H01L 29/7833* (2013.01); *H01L 21/823468* (2013.01); *H01L 27/088* (2013.01); *H01L 29/6656* (2013.01); *H01L 29/6659* (2013.01)

(58) Field of Classification Search
CPC ............. H01L 29/7833; H01L 29/6659; H01L 29/6656; H01L 21/823468; H01L 27/088
See application file for complete search history.

(56) References Cited

U.S. PATENT DOCUMENTS

| | | | | |
|---|---|---|---|---|
| 6,316,304 B1 * | 11/2001 | Pradeep | .......... | H01L 21/823468 257/371 |
| 6,777,283 B2 * | 8/2004 | Maeda | .............. | H01L 21/82385 257/371 |
| 7,456,066 B2 | 11/2008 | Wu | | |
| 7,952,142 B2 * | 5/2011 | Wu | .................. | H01L 21/823864 257/336 |
| 2007/0114604 A1 | 5/2007 | Huang et al. | | |
| 2012/0025323 A1 * | 2/2012 | Teo | ................. | H01L 21/823425 257/384 |
| 2014/0103441 A1 * | 4/2014 | Kim | .................. | H01L 21/82345 257/368 |

* cited by examiner

*Primary Examiner* — Mark Prenty
(74) *Attorney, Agent, or Firm* — NSIP Law

(57) ABSTRACT

A semiconductor device and a method of manufacturing the semiconductor device includes forming a first and a second gate electrode on a semiconductor substrate, forming a first and a second insulator on the first and second gate electrodes, forming a third insulator on the second insulator, a first thickness of the third insulator on the first gate electrode being different than a second thickness of the third insulator on the second gate electrode, and etching-back the first, second and third insulators to form a first spacer beside the first gate electrode and a second spacer beside the second gate electrode. Herein, a horizontal length of the first spacer being contacted with a surface of the semiconductor substrate is different from a horizontal length of the second spacer being contacted with a surface of the semiconductor substrate.

18 Claims, 11 Drawing Sheets

SEMICONDUCTOR DEVICE

CROSS-REFERENCE TO RELATED APPLICATIONS

This application claims the benefit under 35 USC 119(a) of Korean Patent Application No. 10-2014-0014210 filed on Feb. 7, 2014, in the Korean Intellectual Property Office, the entire disclosure of which is incorporated herein by reference for all purposes.

BACKGROUND

1. Field

The following description relates to a plurality of semiconductor devices structure with multiple operating voltage and their manufacturing method with variable sidewall spacer length in one chip.

2. Description of Related Art

As the channel length decrease in the semiconductor device with sub-micron gate length, it is required to reduce the Hot Carrier Effect. Strong electric field adjacent to the drain region provides hot carrier electron to the gate insulator, which results in degradation of device performance due to breakdown of the gate insulator. Traditionally, the light doped drain region has been provided adjacent to highly doped drain region to solve this problem. The area of the Lightly Doped Drain (LDD) region is dependent on the size of sidewall spacer adjacent to gate electrode. As the sidewall spacer becomes longer, the length of lightly doped region also increases. If the device required higher operating voltage, the thickness gate insulator or the channel length should be modified. To make a plurality of semiconductor devices with multiple operation voltages in a one chip, the fabricating method is more complex than one single device in one chip.

There are many methods for fabricating a plurality of semiconductor devices with multiple operation voltages. For example, a method uses different silicon oxide growth rate. Nitrogen or a fluorine atom can be used to implant into the semiconductor substrate. However, such dopants requires further optimization process of ion implantation conditions. In addition, there are problems about device reliability degradation due to unwanted out-diffusion of fluorine atoms.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method for manufacturing semiconductor device including forming a first and a second gate electrode on a semiconductor substrate, forming a first and a second insulator on the first and second gate electrodes, forming a third insulator on the second insulator, a first thickness of the third insulator on the first gate electrode being different than a second thickness of the third insulator on the second gate electrode, and etching-back the first, second, and third insulators to form a first spacer beside the first gate electrode and a second spacer beside the second gate electrode, wherein a horizontal length of the first spacer in contact with a surface of the semiconductor substrate being different than a horizontal length of the second spacer in contact with a surface of the semiconductor substrate.

The first thickness may be smaller than the second thickness.

Forming a third insulator on the second insulator may include depositing a buffer insulator on the second insulator, selectively removing the buffer insulator to expose the second insulator formed on the first gate electrode.

The method may include depositing an additional insulator on the exposed second insulator and the buffer insulator, wherein the first insulator, the second insulator, and the additional insulator are deposited on the first gate electrode, and the first insulator, the second insulator, the buffer insulator, and the additional insulator are deposited on the second gate electrode.

The buffer insulator and the additional insulator my be formed of a same material.

The first and third insulators may be formed of a same material.

The second insulator may be formed of a material different from the first and third insulators.

The horizontal length of the second spacer may be less than or equal to twice the horizontal length of the first spacer.

The second insulator may be thicker than the first insulator.

The second insulator may be an etch stop layer.

In another general aspect, there is provided a semiconductor device, including a first gate insulator formed on a semiconductor substrate, a second gate insulator formed on the semiconductor substrate, the second gate insulator being thicker than the first gate insulator, a first gate conductive layer formed on the first gate insulator, a second gate conductive layer formed on the second gate insulator, a first spacer comprising a bottom insulator, a middle insulator and a upper insulator formed beside the first gate conductive layer, and a second spacer comprising the bottom insulator, the middle insulator and the upper insulator formed beside the second gate conductive layer, wherein a horizontal length of the first spacer in contact with a surface of the semiconductor substrate is different than a horizontal length of the second spacer in contact with a surface of the semiconductor substrate.

The horizontal length of the first spacer may be smaller than the horizontal length of the second spacer.

The middle insulator may be thicker than the bottom insulator.

A cross sectional area of the upper insulator in the second spacer may be larger than a cross sectional area of the upper insulator in the first spacer.

Etch rates of the middle insulator and the upper insulator may be different from each other.

The etch rate of the middle insulator may be smaller than the etch rate of the upper insulator.

The first insulator may be formed of a silicon oxide and the second insulator is formed of a silicon nitride or a silicon oxynitride (SiON).

The length of the second spacer may be less than or equal to twice the length of the first spacer.

The bottom insulator and the upper insulator may be formed of a same material.

In another general aspect, there is provided a semiconductor device, a first gate electrode and a second gate electrode formed on a semiconductor substrate, a lightly doped region formed on the semiconductor substrate on either side of the first gate electrode and the second gate electrode, a first spacer comprising a first bottom insulator, a first middle insulator, and a first upper insulator formed beside the first gate conductive layer, a second spacer comprising a second bottom insulator, a second middle insulator, and a second upper insulator formed beside the second gate conductive layer, an isolation layer disposed between the first gate electrode and the second gate electrode, and a first and a second highly doped region formed on the substrate, between the isolation layer and the lightly doped region of the first gate electrode and the second gate electrode, respectively, wherein the thickness of the first upper insulator being different than the thickness of the second upper insulator. including The lightly doped regions may be formed through LDD ion injection before the insulators are formed.

The semiconductor device may include a first gate insulator and a second gate insulator configured to isolate the substrate from the first gate electrode and the second first gate electrode, respectively.

Example disclosed in the present application propose a semiconductor device and a manufacturing method manufacturing transistors having a different length from each other in a same semiconductor chip.

Example disclosed in the present application propose a semiconductor device and the manufacturing method manufacturing the transistors having a different length from each other in a same semiconductor chip without an ion injection of a nitrogen ion or a fluorine ion.

Example disclosed in the present application propose a semiconductor device and the manufacturing method of insulator manufacturing transistors having different lengths with each other and using an insulator having three layers.

Example disclosed in the present application propose a semiconductor device and the manufacturing method using a buffer insulator and an additional insulator to form a spacer length difference between first and second transistors.

The semiconductor device and manufacturing method and related technologies according to an example embodiment may form a plurality of transistors having a spacer length different from each other in a same semiconductor chip.

The semiconductor device and manufacturing method and related technologies according to an example embodiment may selectively form a spacer length optimized the operating voltage of each of the plurality of the transistors.

The semiconductor device and manufacturing method and related technologies according to an example embodiment may simultaneously process an ion injecting procedure for the plurality of the transistors to simplify a device manufacturing process.

Other features and aspects may be apparent from the following detailed description, the drawings, and the claims.

Figure 1:
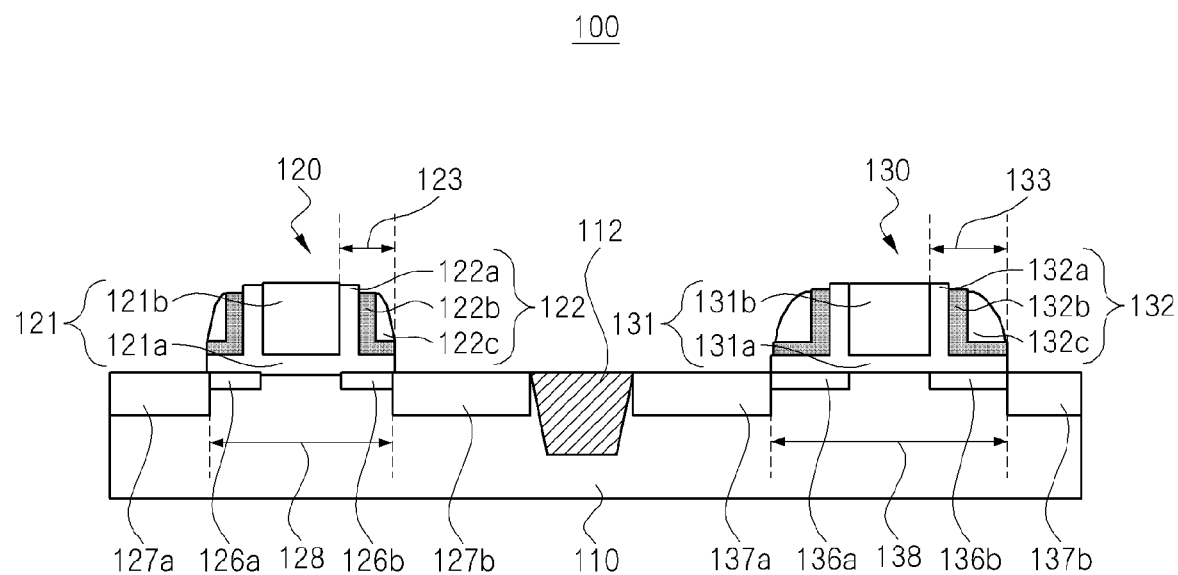
FIG. 1 is a diagram illustrating an example of two semiconductor devices.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

While terms such as "first" and "second," etc., may be used to describe various components, such components must not be understood as being limited to the above terms. The above terms are used only to distinguish one component from another. For example, a first component may be referred to as a second component without departing from the scope of rights of the present application, and likewise a second component may be referred to as a first component. It will be understood that when an element is referred to as being "connected to" another element, it can be directly connected to the other element or intervening elements may also be present. In contrast, when an element is referred to as being "directly connected to" another element, no intervening elements are present.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is diagram illustrating an example of two semiconductor devices. Referring to FIG. 1, a semiconductor device 100 includes first and second transistors 120 and 130 formed on a semiconductor substrate 110.

The first transistor 120 includes a first gate stack 121, a first LDD spacer 122, first lightly doped regions 126*a* and 126*b* (collectively 126) and first highly doped regions 127*a* and 127*b* (collectively 127). The second transistor 130 includes a second gate stack 131, a second LDD spacer 132, second lightly doped regions 136*a* and 136*b* (collectively 136) and second highly doped regions 137*a* and 137*b* (collectively 137).

The lightly doped regions 126 and 136 need to reduce Hot Carrier Effect generated according to a gate length decrease in the semiconductor device. Strong electric field is reduced in the lightly doped regions 126 and 136.

The lightly doped regions 126 and 136 may decrease the Hot Carrier Effect caused by the strong electric field in a drain junction and may have a small LDD junction depth under a gate electrode to decrease an overlap capacitance between a gate, a drain and a source.

Each of the gate stacks 121 and 131 comprises a gate insulator 121*a*, 131*a* and a gate conductive layer 121*b* and 131*b*. The gate insulator 121*a* may function to isolate the gate conductive layer 121*b* and the semiconductor substrate 110. The gate conductive layer 121*b* may function as the gate electrode.

A thickness of the gate insulator 121*a* used for the first transistor 120 may be smaller than that of the gate insulator 131*a* used for the second transistor 130. This is because an operating voltage of the first transistor 120 is set smaller than that of the second transistor 130. A thickness (or a height) of each of the gate conductive layers 121b and 131b used for the first and second transistors 120 and 130 may be substantially same or different. In these examples, the thickness of the gate conductive layers 121b and 131b are substantially same due to a process simplification. Each of the spacers 122 and 132 has different length. A width of the gate conductive layers 121b and 131b being used for the first and second transistors 120 and 130 may be substantially same or different. In these examples, the width of the second transistor 130 having a high operating voltage is wider than that of the first transistor 120 so that a device performance may be stably implemented in the high operating voltage.

An isolation layer 112 between the first and second transistors 120 and 130 may be required for device isolation. A depth of the isolation layer 112 may be deeper than that of the highly doped regions 127 and 137 for the device isolation. The isolation layer 112 may use a silicon oxide. A linear silicon nitride may be added between the silicon oxide and the semiconductor substrate 110 for a stress decrease.

In one example, the gate stacks 121 and 131 are formed by sequentially depositing the gate insulators 121a and 131a, a poly-silicon, patterning and using the photo resist and the hard mask. The silicon oxide or a silicon nitride may be used as the hard mask.

The spacers 122 and 132 adjoin both side of the gate stacks 121 and 131 and are formed as the insulator. Also, the spacers 122 and 132 may be formed on the lightly doped regions 126 and 136 and the highly doped regions 127 and 137. The spacers 122 and 132 may be mainly formed on the lightly doped regions 126 and 136. A width or a length of the lightly doped regions 126 and 136 may be determined based on a width, a horizontal length or an area of the spacers 122 and 132. The width or the length of the lightly doped regions 126 and 136 increases with the increase in the width, the length or the area of the spacers 122 and 132. The spacers 122 and 132 generate a doped concentration difference between the lightly doped regions 126 and 136 and the highly doped regions 127 and 137 in an ion implantation procedure. This is because an ion implantation procedure is performed for the highly doped region 127 after forming the spacers 122 and 132. Because a doped concentration of the lightly doped regions 126 and 136 is relatively lower than that of the highly doped regions 127 and 137, the larger the area or length of the spacers 122 and 132 becomes, the larger the length or area of the lightly doped regions 126 and 136 becomes.

Each of the spacers 122 and 132 comprises bottom insulators, middle insulators and upper insulators. An fabrication method of the spacers will be described with reference to FIG. 3.

Spacer lengths 123 and 133 may determine channel lengths 128 and 138 of a corresponding transistor and the corresponding channel lengths 128 and 138 may determine an internal operation voltage that the transistor may withstand. Each of the spacer lengths 123 and 133 corresponds to a horizontal length of each of the spacers 122 and 132 adjoining the semiconductor substrate 110. In FIG. 1, the spacer length 133 of the second transistor 130 is larger than the spacer length 123 of the first transistor 120. The spacer lengths 123 and 133 may be determined by spacer thickness formed on sidewalls of the gates 121 and 131.

Each of the spacers 122 and 132 is a structure where at least two of the insulators are deposited. The examples shown herein use an insulator structure depositing three insulating structures. The bottom insulators 122a and 132a are formed of the silicon oxide and the middle insulators 122b and 132b are formed of the silicon nitride or a silicon oxynitride to function as an etching stop layer. An etch rate of the bottom insulators 122a and 132a and the middle insulators 122b and 132b may be different. The upper insulators 122c and 132c use the silicon oxide. An etch rate of the upper insulators 122c and 132c and the middle insulators 122b and 132b may be different. The bottom insulators 122a and 132a and the upper insulators 122c and 132c may use the same material. A thickness of the upper insulators 122c and 132c may be determined different from each other to adjust the spacer length. For example, when the thickness of the upper insulator 132c in the second transistor 130 is thicker than that of the upper insulator 122c in the first transistor 120, the spacer length 133 of the second transistor 130 may be larger than the spacer length 123 of the first transistor 120. A procedure enlarging the thickness of the upper insulators 122c and 132c will be described with reference to FIG. 3. The thickness of the bottom insulators 122a and 132a may be same in a structure of the first and second transistors 120 and 130. The thickness of the middle insulators 122b and 132b may be same in the structure of the first and second transistors 120 and 130.

The thickness of the bottom insulators 122a and 132a, the middle insulators 122b and 132b and the upper insulators 122c and 132c is gradually increased. A nitride is used as the etching stop layer in the middle insulators 122b and 132b and the thickness of the middle insulators 122b and 132b may be thicker than that of the bottom insulators 122a and 132a. Also, the upper insulators 122c and 132c are thickest in order to easily adjust insulators an etch back and the spacer length.

When widths of the spacers 123 and 133 become longer, higher operating voltage may be used. For example, when the first transistor 120 is operated at about 1V through about 4V, the spacer length 133 of the second transistor 130 is long enough to operate at about 5V through about 10V larger than the operating voltage of the first transistor 120. Therefore, the examples are suitable for a plurality of elements where the operating voltage of the transistor is about 1V through about 30V in a single chip. The second spacer length 133 may be more than or equal to 1.2 times and less than or equal to 2.0 times of the first spacer length 123. Thereby, the first transistor 120 may operate at about 1V through about 4V and the second transistor 130 may operate at about 5V through about 10V larger than the operating voltage of the first transistor 120.

The lightly doped regions 126 and 136 correspond to an ion doped region under spacers 122 and 132 and have a lightly doped concentration relative to the highly doped regions 127 and 137. The highly doped regions 127 and 137 have higher doped concentration than the lightly doped concentration.

FIG. 2 illustrates electrical parameters of the transistor according to different spacer lengths 123 and 133. The spacer length of the first and second transistors 120 and 130 being different from each other and the spacer length 133 of the second transistor 130 is wider than the spacer length 123 of the first transistor 120. Although the first and second transistors 120 and 130 are manufactured in a same procedure, the first and second transistors 120 and 130 have different channel characteristics according to the respective spacer lengths 123 and 133. The spacer lengths 123 and 133 correspond to a horizontal length of the spacer adjoining the semiconductor substrate 110.

Figure 2A:
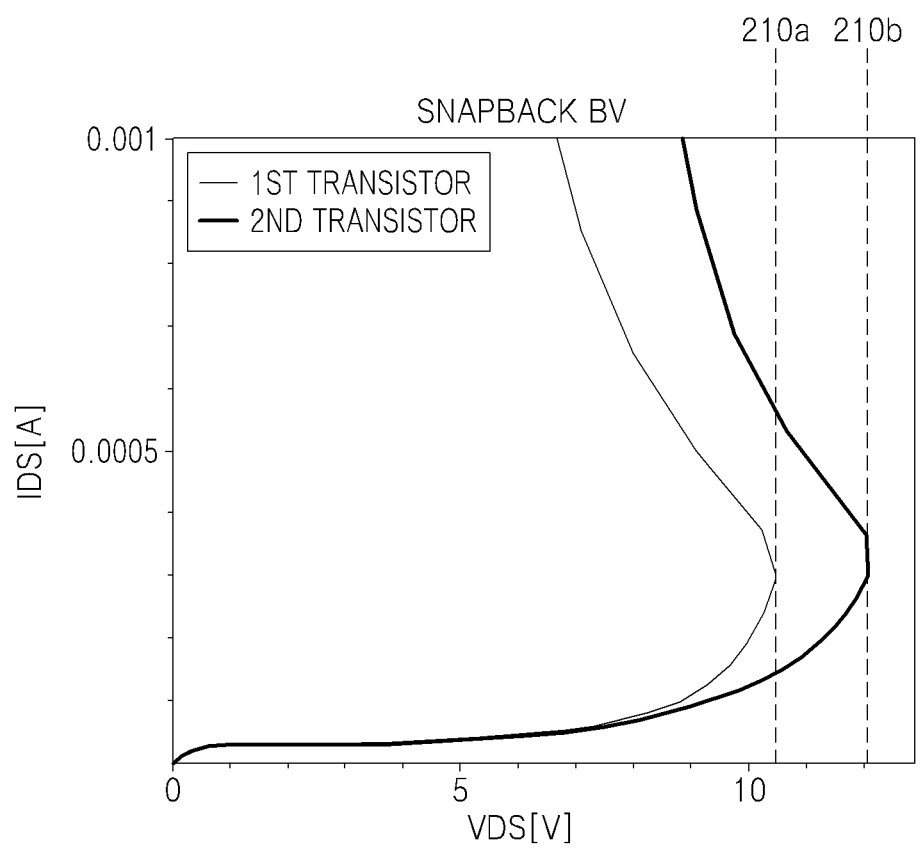
FIGS. 2A-2B are diagrams illustrating examples of electrical parameters of semiconductor devices.

FIG. 2A illustrates a graph of a relationship between a VDS (a source/drain voltage) and IDS (a source/drain current) measured from each of the first and second transistor when the spacer lengths 123 and 133 of the first and second transistors 120 and 130 are 800 Å and 1600 Å, respectively.

As shown in FIG. 2A, the first and second transistors 120 and 130 maintain a low value of the IDS according to an increase of the VDS. However, when the VDS is more than a specific breakdown voltage (BV) 210, the IDS rapidly increased by an avalanche. In FIG. 2A, when the VDS of the second transistor 130 is about 12V and that of the first transistor 120 is about 10V, the IDS is rapidly increased. Herein, the channel length is changed so that an avalanche generating interval may be different.

Figure 2B:
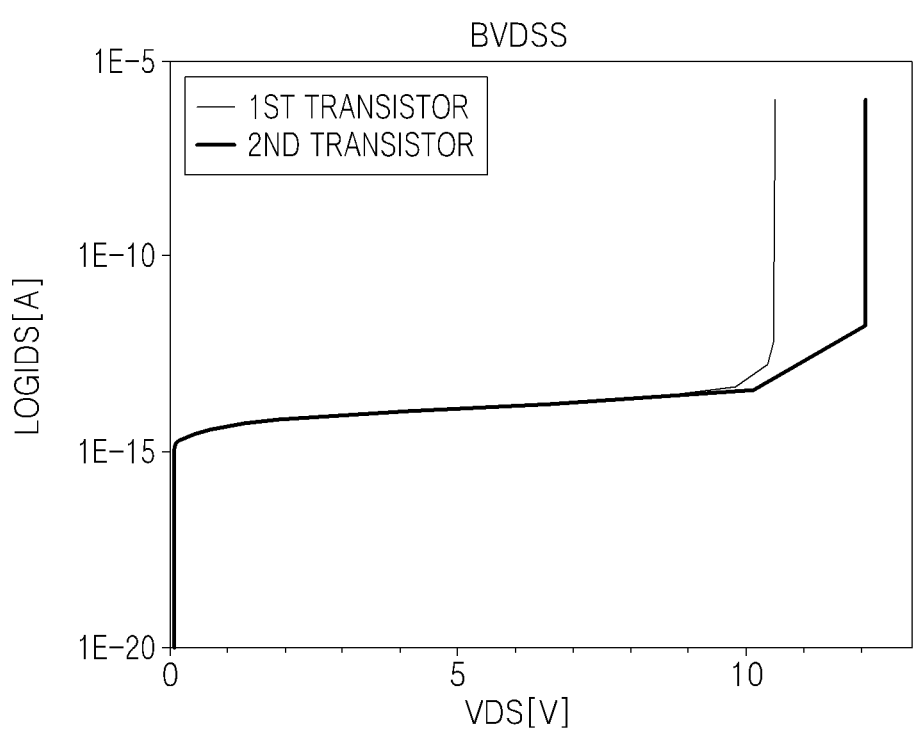

FIG. 2B illustrates a graph showing a BVDSS measured from each of the transistors 120 and 130 when the channel lengths 128 and 138 of the first and second transistors 120 and 130 are respectively about 800 Å and about 1600 Å. When the channel lengths 128 and 138 are longer, the breakdown voltage 210 may be increased to operate in a larger operating voltage.

As described in FIG. 2B, the first and second transistors 120 and 130 maintain the high breakdown voltage more than or equal to about 10V, the channel length of the second transistor 130 is longer than that of the first transistor 120 so that the breakdown voltage 210 occurs at about 12V. Therefore, the operating voltage of the second transistor 130 may be higher than that of the first transistor 120.

Although the plurality of the transistors is implemented in a same device, the operating voltage of the plurality of the transistors may be different from each other. The plurality of the transistors may have the channel lengths 128 and 138 corresponding each of the operating voltage to withstand the operating voltage.

The corresponding channel lengths 128 and 138 may change the spacer lengths 123 and 133 to adjust. The greater the spacer lengths 123 and 133, the greater is the corresponding channel lengths 128 and 138.

Figure 3A:
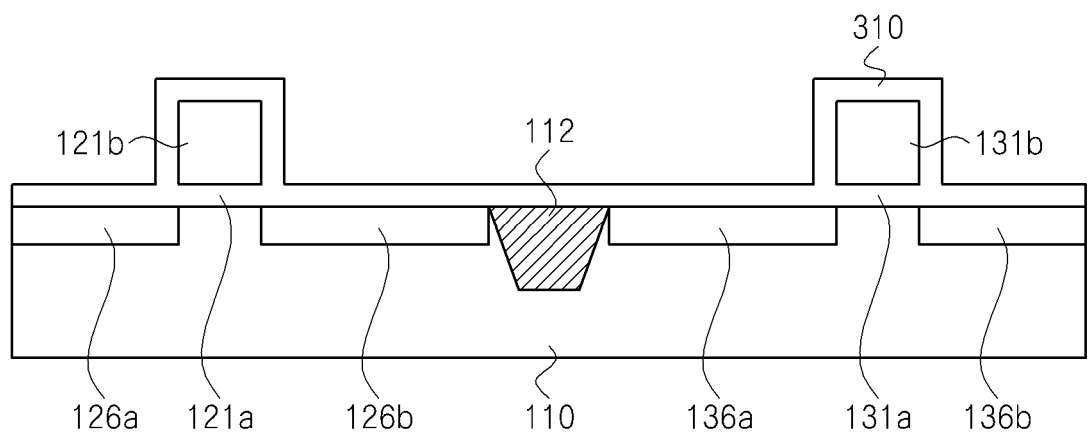
FIGS. 3A-3H are diagrams illustrating examples of manufacturing methods of two semiconductor devices.

FIGS. 3A-3H are cross sectional diagrams illustrating a manufacturing method of two semiconductor devices. In FIG. 3A, each of the gate stacks 121 and 131 is formed on a position arranging the first and second transistors on the semiconductor substrate 110. The gate stacks 121 and 131 sequentially deposits the gate insulators 121a and 131a, the poly silicon 121b and 131b and the hard mask (not shown) and use the photo resist and the hard mask after the patterning to be formed. Herein, the silicon oxide, the silicon nitride, and the silicon oxynitride may be used as the hard mask.

After the gate stacks 121 and 131 are formed, the LDD regions 126a and 126b may be formed. The lightly doped regions 126a and 126b are formed on the silicon semiconductor substrate 110 exposed on both sides of a gate structure through the LDD ion injection before an insulator for the spacer is deposited. The spacers are formed on both sides of the gate structure according to the procedure described below.

A first insulator 310 is formed on the first and second gate stacks 121 and 131. The first insulator 310 uses a silicon oxide of thickness 50 Å through 300 Å. The first insulator 310 forms the spacers 122a and 132a for the first and second transistors 120 and 130, respectively.

Figure 3B:
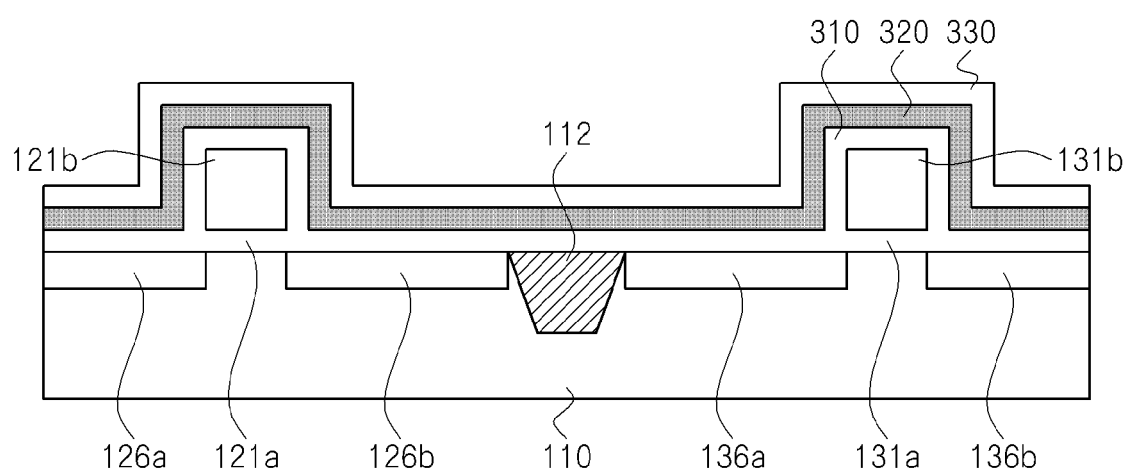

In FIG. 3B, a second insulator 320 is formed on the first insulator 310. In one embodiment, when a buffer insulator 330 is removed using a wet etch, a material of the second insulator 320 is different from a material of the first insulator 310 and the buffer insulator 330 so that the second insulator may function as the etching stop layer. For example, the second insulator 320 may be formed of the silicon nitride (SiN) and the silicon oxynitride (SiON). A layer including nitrogen atoms is suitable for the second insulator 320 and a thickness of the second insulator 320 may be about 300 Å through about 700 Å. The thickness of the second insulator 320 may be thicker than that of the first insulator 310. This is because the second insulator 320 may function as the etching stop layer.

A procedure of forming a third insulator on the second insulator 320 where a thickness of the third insulator on the first gate electrode and that of the third insulator on the second gate electrode is different will be described below.

After forming the second insulator 320 in FIG. 3B, the buffer insulator 330 composed of the silicon oxide is formed on the second insulator 320. A thickness of the buffer insulator 330 that is deposited may be from 800 Å to 3000 Å. The thickness of the buffer insulator 330 is thicker than that of the second insulator 320. The buffer insulator 330 provides different spacer length 123 and 133 of the first and second transistors 120 and 130.

For example, when the spacer length 123 of the first transistor 120 is implemented as 1500 Å and the spacer length 133 of the second transistor 130 is implemented as 2000 Å, a thickness of the buffer insulator 330 may be implemented as 500 Å corresponding to a difference of the corresponding spacer length.

Figure 3C:
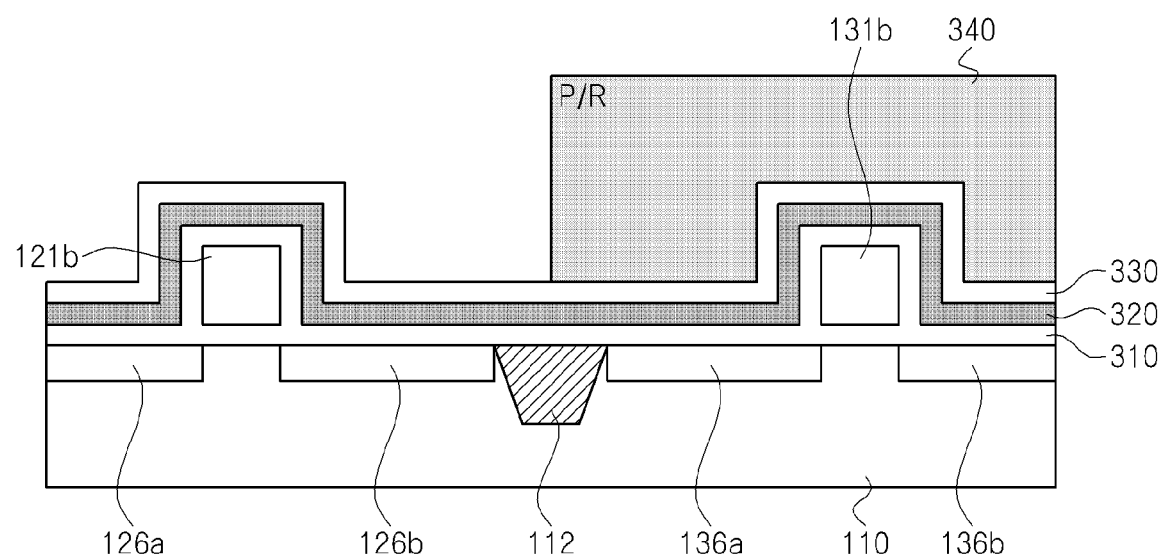

In FIG. 3C, the photo resist 340 is formed on an upper portion of the second transistor 130. The photo resist 340 may protect the upper portion of the second transistor 130 to maintain the spacer length 133 of the second transistor 130.

The buffer insulator 330 is selectively etched so that the second insulator 320 is exposed on the first gate stack 121 in the first transistor 120. The buffer insulator 330 of the upper portion of the first transistor 120 is not protected through the photo resist 340 to be etched and that of the upper portion of the second transistor 130 is protected through the photo resist 340 not to be etched.

The second transistor 130 is protected through the photo resist 340 so that the spacer length 133 of the second transistor 130 is longer than the spacer length 123 of the first transistor 120 and maintains a spacer difference (i.e., a thickness difference of the buffer insulator 330).

Figure 3D:
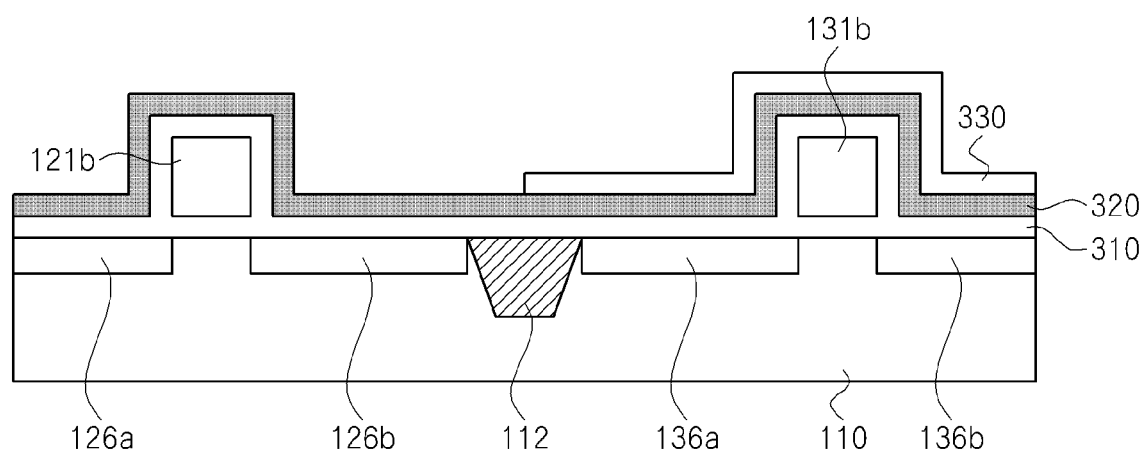

In FIG. 3D, a wet etching procedure or a dry etching procedure using a buffered oxide etch (BOE) solution removes the buffer insulator 330 on the upper portion of the first transistor 120a to expose the second insulator 320. In these example, the buffer insulator 330 is removed by using the wet etching procedure. This is because the wet etch may completely remove the buffer insulator 330. When the buffer insulator 330 on the upper of the first transistor 120a is removed, the second insulator 320 blocks from the etching procedure from progressing further. The etch rate of the second insulator 320 may be different from the etch rate of the buffer insulator 330 and the etch rate of the second insulator 320 may be smaller than that of the buffer insulator 330 to prevent the additional process. After the etching procedure, the second insulator 320 is exposed on the first gate stack 121, and the first and second insulators 310 and 320 still remain. The photo resist 340 is removed thereby the first transistor 120 is formed with the first and second insulators 310 and 320 on the first gate electrode. The second transistor 130 is formed with the first and second insulators 310 and 320 and the buffer insulator 330 on the second gate electrode.

Figure 3E:
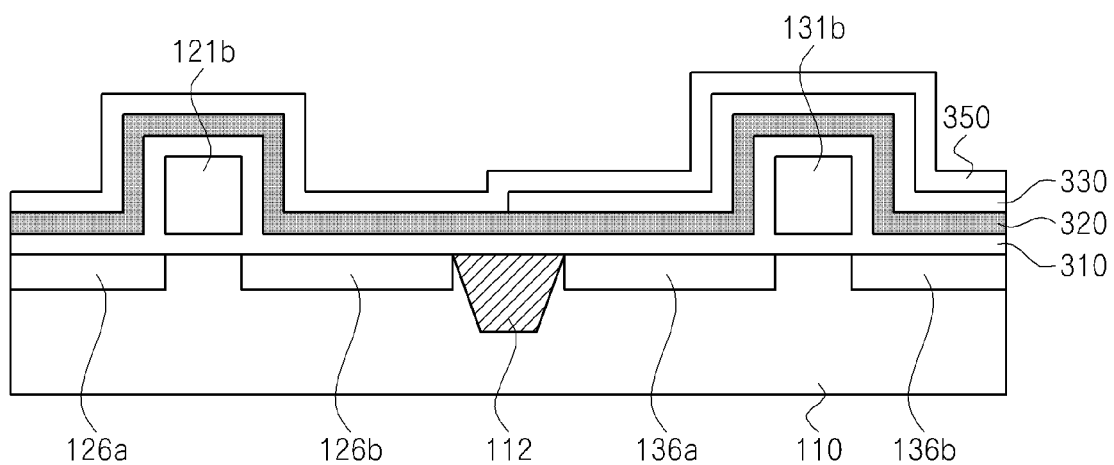

In FIG. 3E, the additional insulator 350 is deposited on upper portions of the first and second transistors 120 and 130. The first transistor 120 deposits the additional insulator 350 on top of the first and second insulators 310 and 320. In the second transistor 130, the additional insulator 350 is deposited on the first and second insulators 310 and 320 and the buffer insulator 330. Thereby a multilayer comprising the first insulator 310 and second insulators 320 and the additional insulator 350 is stacked on the first gate electrode 121b. On the other hand, a multilayer comprising the first insulator 310 and second insulator 320, the buffer insulator 330 and the additional insulator 350 is stacked on the second gate electrode 131b.

When the buffer insulator 330 uses silicon oxide, the additional insulator 350 may use silicon oxide. The additional insulator 350 use the same material as that of the buffer insulator 330 to easily make a spacer shape through etch-back process. If the different materials between the buffer insulator and additional insulator are used, required etching processing is more complex to make spacer shape. An end point of additional insulator 350 is aligned with an end point of the first and second insulators.

A third insulator is considered to be the buffer insulator 330 or the additional insulator 350 or a stacking layer of the buffer insulator and additional insulator. The thickness of the third insulator 350 on the first gate electrode may be smaller than that on the second gate electrode. The thickness of the third insulator on the first gate electrode and that of the third insulator on the second gate electrode may be different. Forming the third insulator on the second insulator includes depositing a buffer insulator 330 (FIG. 3B). Selectively removing the buffer insulator 330 on the first gate electrode is performed so that the second insulator 320 formed on the first gate electrode is exposed (FIGS. 3C and 3D). After the buffer insulator 330 is selectively removed, an additional insulator 350 is deposited on the exposed second insulators 320 and the buffer insulator 330.

Figure 3F:
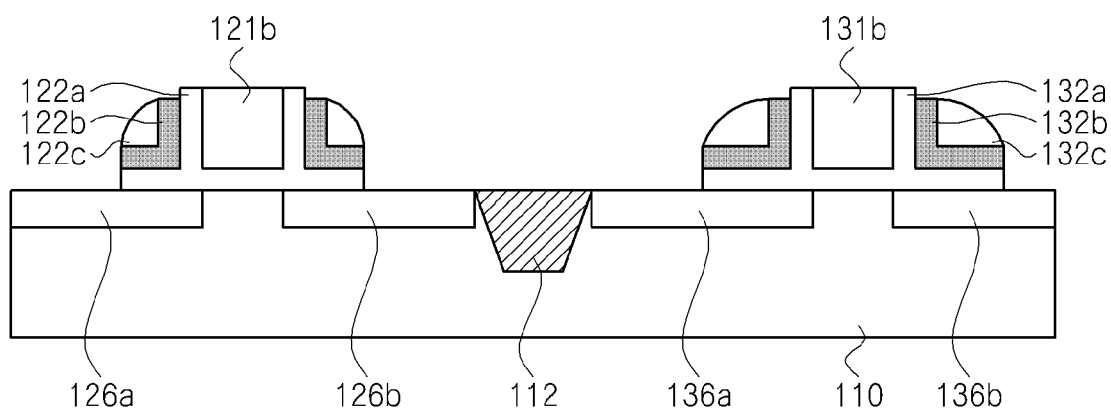

In FIG. 3F, the shape of the spacers 122 and 132 is formed. A surface of the semiconductor substrate is exposed by the above etch-back process. Therefore, the first spacer 122 is formed on sidewall of the first gate 121b. The second spacer 132 is formed on the sidewall of the second gate 131b. The first spacer 122 includes the bottom insulator 122a, the middle insulator 122b, and the upper insulator 122c. The second spacer 132 includes the bottom insulator 132a, the middle insulator 132b, and the upper insulator 132c. The bottom insulators 122a and 132a are formed from the first insulator 310. The middle insulators (or the etching stop layers) 122b and 132b is formed from the second insulator 320. The upper insulator 122c of the first spacer is formed from the additional insulator 350. The upper insulator 132c of the second spacer is formed from the buffer insulator 330 and the additional insulator 350. The buffer insulator 330 and the additional insulator 350 are formed of a same material so that the buffer insulator 330 and the additional insulator 350 may not be distinguished each other in the upper insulator 132c of the second spacer 132.

As described above, when the first insulator 310 is formed of silicon oxide, the bottom insulators of the first and second spacers may be formed of the silicon oxide. When the second insulator 320 is formed of silicon nitride or silicon oxynitride (SiON), the middle insulators of the first and second spacers may be formed of silicon nitride or silicon oxynitride (SiON). When the third insulator (the buffer insulator or the additional insulator) is formed of the silicon oxide, the upper insulators of the first and second spacers may be formed of silicon oxide. A shape of the bottom insulator and the middle insulator are L shaped, otherwise an outside is curved and an inside is perpendicular due to the shape of the middle insulator.

A thickness of the bottom insulator 122a in the first spacer 122 may be substantially equal to that of the bottom insulator 132a in the second spacer 132. A thickness of the middle insulator 122b in the first spacer 122 may be substantially equal to or smaller than that of the middle insulator 132b in the second spacer 132. This is because the middle insulator 122b of the first spacer 122 may be at a loss due to the wet etching.

A thickness of the upper insulator 122c in the first spacer 122 is smaller than that of the upper insulator 132c in the second spacer 132. It can also be said that an area of the upper insulator 122c in the first spacer 122 is smaller than that of the upper insulator 132c in the second spacer 132, where the area may correspond to a cross sectional area. This is because the upper insulator 122c in the first spacer 122 is formed with the additional insulator 350 but the upper insulator 132c in the second spacer 132 is formed with the buffer insulator 330 and the additional insulator 350. Therefore, a difference between widths of the first and second spacer adjoining the semiconductor substrate is generated by the thickness of the buffer insulator 330. When the thickness of the buffer insulator 330 is about 50 nm, the difference between widths of the first and second spacer may be about 50 nm. Therefore, a difference of the spacer length may be adjusted by the thickness of the buffer insulator 320. The channel length 128 of the first transistor 120 may be smaller than the channel length 138 of the second transistor 130.

These examples may differentiate an area or a thickness of the upper insulator to cause horizontal lengths of the first and second spacers 131 and 132 to be different. However, an area or a thickness of the bottom insulator or the middle insulator may be differentiated to cause horizontal lengths of the first and second spacers 131 and 132 to be different. An area or a thickness of the first spacer 122 may be implemented to be larger than that of the second spacer 132.

Also, the first spacer 122 is formed with the bottom insulator 122a, the etching stop layer 122b and the upper insulator 122c and the second spacer is formed with the bottom insulator 132a, the etching stop layer 132b and the upper insulator 132c so that the second insulator 320 is used for the etching stop layer.

Figure 3G:
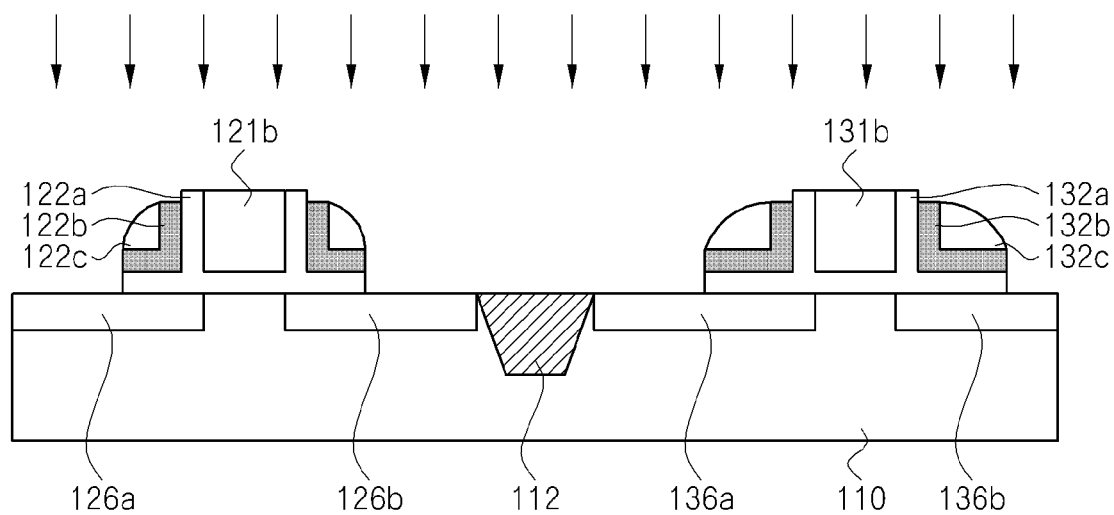

In FIG. 3G, the ion implantation procedure is performed to form highly doped region 127 by using P+ or N+ type dopants with high doping concentration. The ion implantation procedure may simplify a device manufacturing process so that the ion implantation procedure is not separately processed but integrally processed with the first and second transistors 120 and 130.

Figure 3H:
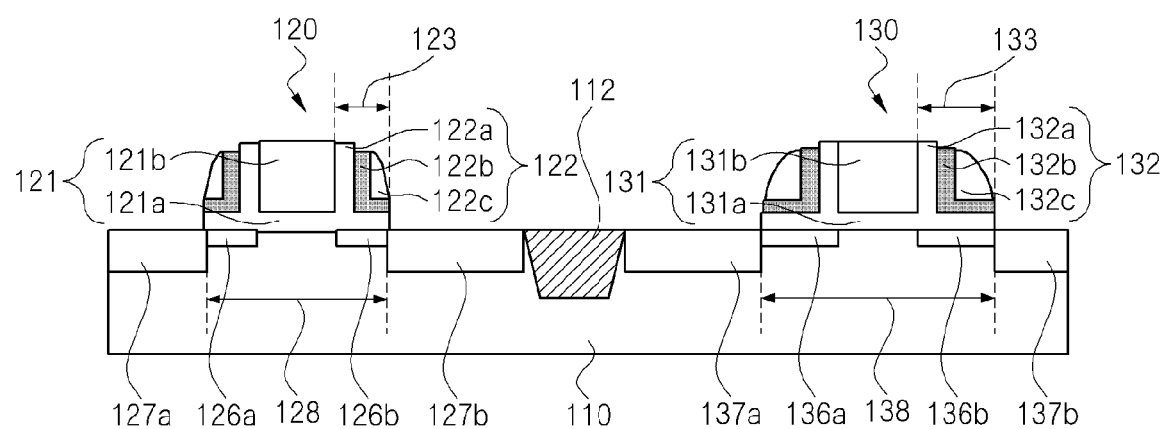

In FIG. 3H, a shape of the first and second transistors 120 and 130 is completed. Each of the spacer lengths 123 and 133 of the completed first and second transistors 120 and 130 may be different and each of the operating voltages may be differently maintained by a difference between the corresponding spacer lengths 123 and 133.

In a non-exhaustive example, the first transistor 120 may be used for a low voltage (LV) device and the second transistor 130 may be used for a high voltage (HV) device. The channel length 138 of the second transistor 130 may be longer than the channel length 128 of the first transistor 120 to maintain the breakdown voltage 210 more than 10V and the operating voltage of the second transistor 130 may be higher than that of the first transistor 120. For example, when the first transistor 120 operates at about 1V through 4V, the spacer length 133 is lengthened so that the second transistor 130 may operate at about 5V through about 10V higher than the operating voltage of the first transistor 120. Therefore, the examples described above are suitable for the plurality of devices in a single chip where the operating voltage is about 1V through about 30V.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

100: SEMICONDUCTOR DEVICE
110: SEMICONDUCTOR SUBSTRATE
120: FIRST TRANSISTOR
121: GATE STACK
122: SPACER
122a: BOTTOM INSULATOR
122b: MIDDLE INSULATOR OR ETCHING STOP LAYER
122c: UPPER INSULATOR
123: SPACER LENGTH
126: LIGHTLY DOPED REGION
127: HIGHLY DOPED REGION
128: CHANNEL LENGTH
130: SECOND TRANSISTOR
131: GATE STACK
132: SPACER
132a: BOTTOM INSULATOR
132b: MIDDLE INSULATOR OR ETCHING STOP LAYER
132c: UPPER INSULATOR
133: SPACER LENGTH
136: LIGHTLY DOPED REGION
137: HIGHLY DOPED REGION
138: CHANNEL LENGTH
210: BREAKDOWN VOLTAGE
310: FIRST INSULATOR
320: SECOND INSULATOR
330: BUFFER INSULATOR
340: PHOTO RESIST
350: ADDITIONAL INSULATOR

What is claimed is:

1. A semiconductor device, comprising
a first gate insulator formed on a semiconductor substrate;
a second gate insulator formed on the semiconductor substrate, the second gate insulator being thicker than the first gate insulator;
a first gate conductive layer formed on the first gate insulator;
a second gate conductive layer formed on the second gate insulator;
a first spacer, comprising a first bottom insulating layer, a first middle insulating layer overlying the first bottom insulating layer, and a first upper insulating layer overlying the first middle insulating layer, the first spacer formed beside the first gate conductive layer; and
a second spacer, comprising a second bottom insulating layer, a second middle insulating layer overlying the second bottom insulating layer and a second upper insulating layer overlying the second middle insulating layer, the second spacer formed beside the second gate conductive layer,
wherein a horizontal length of the first spacer in contact with a surface of the semiconductor substrate is different than a horizontal length of the second spacer in contact with a surface of the semiconductor substrate,
wherein an end point of the second upper insulating layer is aligned with an end point of the second bottom insulating layer and the second middle insulating layer, and
wherein a cross sectional area of the second upper insulating layer is larger than a cross sectional area of the first upper insulating layer.

2. The semiconductor device of claim 1, wherein the horizontal length of the first spacer is smaller than the horizontal length of the second spacer.

3. The semiconductor device of claim 1, wherein the second middle insulating layer is thicker than the first middle insulating layer.

4. The semiconductor device of claim 1, wherein materials of the first middle insulating layer and the first upper insulating layer are different from each other.

5. The semiconductor device of claim 1, wherein the first and second bottom insulating layers are formed of a silicon oxide and the first and second middle insulating layers are formed of a silicon nitride or a silicon oxynitride (SiON).

6. The semiconductor device of claim 1, wherein the length of the second spacer is less than or equal to twice the length of the first spacer.

7. The semiconductor device of claim 1, wherein the second upper insulating layer comprising an insulating layer and a buffer layer, and wherein the insulating layer and the buffer layer are formed of a same material.

8. A semiconductor device, comprising
a first gate electrode and a second gate electrode formed on a semiconductor substrate;
a first gate insulator and a second gate insulator configured to isolate the substrate from the first gate electrode and the second gate electrode, respectively, the second gate insulator being thicker than the first gate insulator;
a lightly doped region formed on the semiconductor substrate on either side of the first gate electrode and the second gate electrode;
a first spacer, comprising a first bottom insulating layer, a first middle insulating layer overlying the first bottom insulating layer, and a first upper insulating layer overlying the first middle insulating layer, formed beside the first gate conductive layer;
a second spacer, comprising a second bottom insulating layer, a second middle insulating layer overlying the second bottom insulating layer, and a second upper insulating layer overlying the second middle insulating layer, formed beside the second gate conductive layer;
an isolation layer disposed between the first gate electrode and the second gate electrode; and
a first and a second highly doped region formed on the substrate, between the isolation layer and the lightly doped region of the first gate electrode and the second gate electrode, respectively,
wherein the thickness of the first upper insulating layer is different than the thickness of the second upper insulating layer, and
wherein an end point of the second upper insulating layer is aligned with an end point of the second bottom insulating layer and the second middle insulating layer.

9. The semiconductor device of claim 8, wherein the lightly doped regions are formed through LDD ion injection before the first and second spacers are formed.

10. The semiconductor device of claim 1, wherein at least a portion of each of the first bottom insulating layer, first middle insulating layer, and first upper insulating layer overlap in a direction normal to a major surface of the semiconductor substrate.

11. The semiconductor device of claim 10, wherein at least a portion of each of the first bottom insulating layer, first middle insulating layer, and first upper insulating layer overlap in a direction parallel to the major surface of the semiconductor substrate.

12. The semiconductor device of claim 8, wherein a portion of the lightly doped region on either side of the first gate electrode has a length smaller than a length of a portion of the lightly doped region on either side of the second gate electrode.

13. The semiconductor device of claim 8, wherein a portion of the lightly doped region overlapped by the first spacer has a length smaller than a length of a portion of the lightly doped region overlapped by the second spacer.

14. The semiconductor device of claim 8, wherein the first bottom insulating layer and the second bottom insulating layer have approximately the same thickness.

15. The semiconductor device of claim 1, wherein the first bottom insulating layer and the first middle insulating layer have an L-shape.

16. The semiconductor device of claim 7, wherein the first upper insulating layer is not comprised of the buffer layer.

17. A semiconductor device, comprising
a first gate insulator formed on a semiconductor substrate;
a second gate insulator formed on the semiconductor substrate;
a first gate conductive layer formed on the first gate insulator;
a second gate conductive layer formed on the second gate insulator, the second gate insulator being thicker than the first gate insulator;
a first spacer, comprising a first bottom insulating layer, a first etch stop layer overlying the first bottom insulating layer, and a first upper insulating layer overlying the first etch stop layer, formed beside the first gate conductive layer; and
a second spacer, comprising a second bottom insulating layer, a second etch stop layer overlying the second bottom insulating layer, and a second upper insulating layer overlying the second etch stop layer, formed beside the second gate conductive layer,
wherein a horizontal length of the first spacer in contact with a surface of the semiconductor substrate is different than a horizontal length of the second spacer in contact with a surface of the semiconductor substrate, and
wherein an end point of the second upper insulating layer is aligned with an end point of the second bottom insulating layer and the second etch stop layer,
wherein the second etch stop layer is thicker than the first etch stop layer.

18. The semiconductor device of claim 8, wherein the second middle insulating layer is thicker than the first middle insulating layer.

* * * * *